United States Patent
Wieliczka et al.

(10) Patent No.: US 11,996,264 B1
(45) Date of Patent: May 28, 2024

(54) SAMPLE MOUNT FOR ELECTRON BACKSCATTER DIFFRACTION

(71) Applicant: Honeywell Federal Manufacturing & Technologies, LLC, Kansas City, MO (US)

(72) Inventors: David M. Wieliczka, Overland Park, KS (US); Robert Reis, Lee's Summit, MO (US); Marshall Carter, Harrisonville, MO (US); Ann S. Choi, Overland Park, KS (US); Jason R. Spilker, Overland Park, KS (US); Nicholas Wallace, Leeton, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 18/242,839

(22) Filed: Sep. 6, 2023

(51) Int. Cl.
*H01J 37/20* (2006.01)

(52) U.S. Cl.
CPC ....... *H01J 37/20* (2013.01); *H01J 2237/2007* (2013.01); *H01J 2237/20214* (2013.01)

(58) Field of Classification Search
CPC ............... H01J 37/20; H01J 2237/2007; H01J 2237/20214
See application file for complete search history.

(56) References Cited

U.S. PATENT DOCUMENTS

| | | | | |
|---|---|---|---|---|
| 6,414,322 | B1* | 7/2002 | Carroll | H01J 37/20 250/442.11 |
| 6,576,910 | B2* | 6/2003 | Hashikawa | H01J 37/20 250/442.11 |
| 6,963,069 | B2* | 11/2005 | Tanba | H01J 37/28 250/397 |
| 7,456,403 | B2* | 11/2008 | Tanba | H01J 37/244 250/397 |
| 9,240,304 | B2* | 1/2016 | Miyazaki | H01J 37/20 |
| 2002/0005492 | A1* | 1/2002 | Hashikawa | H01J 37/20 250/442.11 |
| 2002/0162961 | A1* | 11/2002 | Carroll | H01J 37/20 250/311 |

(Continued)

FOREIGN PATENT DOCUMENTS

| | | |
|---|---|---|
| CN | 203216878 U | 9/2013 |
| CN | 108931544 A | 12/2018 |

(Continued)

*Primary Examiner* — David A Vanore
(74) *Attorney, Agent, or Firm* — Erise IP, P.A.

(57) ABSTRACT

A sample mount having a bottom surface, a front surface, and a second portion is disclosed. The first portion is perpendicular to the bottom surface. The second portion has an external surface and an internal surface and extends from the first portion to form a 70-degree angle relative to the bottom surface. The sample mount may also have a top surface, an opening extending through the second portion of the front surface, and a receiving area configured to receive a sample, wherein the top surface presents an unimpeded path between the sample and an SEM pole piece. The sample mount may include a spring-loaded handle configured to push the sample against the internal surface of the second portion of the front surface, wherein pushing the sample against the internal surface places the sample at the 70-degree angle relative to the bottom surface.

20 Claims, 6 Drawing Sheets

(56) References Cited

U.S. PATENT DOCUMENTS

| | | | | |
|---|---|---|---|---|
| 2007/0235645 A1* | 10/2007 | Tanba | ................... | H01J 37/244 |
| | | | | 250/310 |
| 2009/0050803 A1* | 2/2009 | Tanba | ..................... | H01J 37/28 |
| | | | | 250/310 |
| 2012/0120226 A1* | 5/2012 | De Jonge | ................ | H01J 37/20 |
| | | | | 348/80 |
| 2015/0170873 A1* | 6/2015 | Miyazaki | ................ | H01J 37/20 |
| | | | | 250/442.11 |
| 2016/0181059 A1* | 6/2016 | Vystavel | ................ | H01J 37/16 |
| | | | | 250/442.11 |
| 2016/0223803 A1* | 8/2016 | Li | .......................... | G01N 21/01 |
| 2016/0247662 A1* | 8/2016 | Fujii | ..................... | H01J 37/222 |
| 2021/0183612 A1* | 6/2021 | Schwager | .......... | G01N 23/2055 |

FOREIGN PATENT DOCUMENTS

| | | | | |
|---|---|---|---|---|
| CN | 110398508 A | | 11/2019 | |
| CN | 113390907 A | | 9/2021 | |
| EP | 2824448 A1 * | | 1/2015 | ....... G01N 23/20025 |
| EP | 2599103 B1 * | | 3/2017 | ......... G01N 23/2257 |
| WO | WO-9504367 A1 * | | 2/1995 | ............ H01J 37/228 |
| WO | WO-2020108038 A1 * | | 6/2020 | ............. G01N 23/02 |

\* cited by examiner

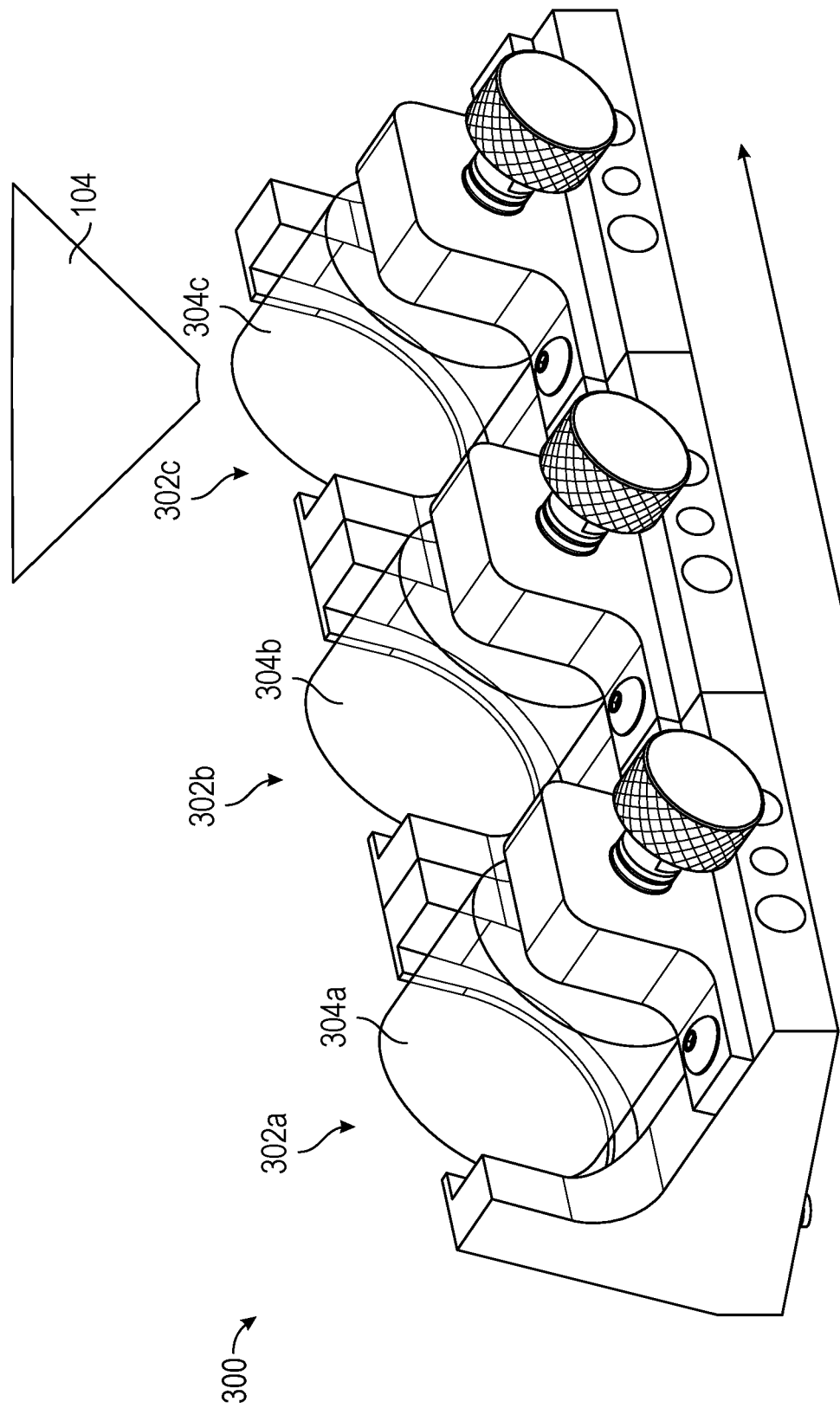

SAMPLE MOUNT FOR ELECTRON BACKSCATTER DIFFRACTION

STATEMENT OF GOVERNMENT SUPPORT

This invention was made with Government support under Contract No.: DE-NA-0002839 awarded by the United States Department of Energy/National Nuclear Security Administration. The Government has certain rights in the invention.

BACKGROUND

1. Field

Embodiments of the present disclosure relate to sample mounts for Electron Backscatter Diffraction (EBSD). More specifically, embodiments of the present disclosure relate to sample mounts for EBSD having a 70-degree tilt and providing an unimpeded path between a scanning electron microscope (SEM) pole piece and a sample.

2. Related Art

EBSD is a SEM technique for determining the crystallographic structure of materials. The EBSD process comprises mounting a sample in a SEM and then projecting a beam of electrons from the SEM onto the sample such that the electrons diffract out of the sample. An EBSD detector (e.g., a CCD or CMOS camera) detects the diffracted electrons, which may be compiled to form an image of the sample. The image of the sample can be analyzed to provide a crystallographic map of the sample surface, among other information. During EBSD data acquisition, the diffracted electrons are used to construct spatial coordinates describing the sample. The spatial coordinates derived from EBSD data acquisition will have an inherent 180-degree rotation compared to the sample. Therefore, to match the spatial coordinates to the orientation of the sample, either the sample or the spatial coordinates must be rotated 180-degrees.

During EBSD, the SEM produces an electron beam projected onto a sample. The electron beam may only diffract within a 5-10 nanometer depth of the sample. If the sample is mounted with a small angle (placing the surface normal near 0-degrees with respect to the electron beam), the number of electrons that diffract out of the sample may be undetectable by EBSD detectors. Similarly, a large-angle mounting (near 90-degrees) may result in an undetectable number of electrons diffracting out of the sample. To produce a high yield of diffracted electrons to be detected by the EBSD detector, thereby producing high contrast in the resulting image for the crystallographic analysis, EBSD samples are typically mounted with the surface normal at 70-degrees with respect to the electron beam (SEM pole piece).

Another factor that affects the quality of the image produced by EBSD is the distance from the SEM pole piece to the sample. The electron beam produced by the SEM pole piece has a focal point within a range of 4-15 millimeters from the SEM pole piece. Mounting the sample outside of this range may reduce the quality of the resulting image by reducing the number of diffracted electrons detected by the EBSD detector. Therefore, mounting the sample within 4-15 millimeters from the SEM pole piece allows for a higher number of diffracted electrons to be detected to produce an optimal image. Traditionally, sample mounts for electron backscatter diffraction rely upon the mounting hardware of a SEM system to place the sample at the required 70-degree angle. However, such mounting hardware typically fails to provide the 70-degree angle. Accordingly, the resulting EBSD images can be erroneous and/or require additional corrective post-processing.

Additionally, conventional sample mounts have material that impedes the path between the SEM pole piece and the sample such that the optimal 4-15 millimeter distance range for mounting is not achievable. For example, conventional sample mounts are often circular such that a portion of the circumference prevents the SEM pole piece from being within the 4-15 millimeter range. Furthermore, conventional sample mounts do not hold the sample perfectly flat at the 70-degree tilt such that the sample presents a planar face. Thus, a time-consuming process for correcting and verifying the sample surface tilt is required. Improvements in EBSD sample mounts are needed.

SUMMARY

Embodiments of the present disclosure solve the above-mentioned problems by providing systems and apparatuses for a sample mount for electron backscatter diffraction data acquisition. The sample mount may hold a sample that protrudes from a top surface of the sample mount and may orient the sample at a 70-degree tilt. The sample mount may further comprise a spring-loaded handle for pushing the sample against a flat front surface to ensure sample surface flatness and a surface tilt of 70-degrees.

In some embodiments, the techniques described herein relate to a sample mount for electron backscatter diffraction data acquisition, including: a front surface extending from a bottom surface of the sample mount, the front surface including: an exterior face; an interior face oriented at a 70-degree angle relative to the bottom surface; an opening extending through the front surface such that the sample mount presents an open top for an unimpeded path from an SEM pole piece to a sample; a first top face and a second top face separated by the opening; a back wall; and a receiving area for receiving the sample, the receiving area located between the front surface and the back wall; and a spring-loaded handle received through the back wall and configured to press the sample against the interior face of the front surface such that a front surface of the sample is flush with the interior face, thereby presenting a planar surface to the SEM pole piece.

In some embodiments, the techniques described herein relate to a sample mount, wherein the sample projects above the first top face and the second top face when disposed in the receiving area.

In some embodiments, the techniques described herein relate to a sample mount, wherein the receiving area includes a geometry corresponding to a geometry of the sample.

In some embodiments, the techniques described herein relate to a sample mount, further including at least one spacer configured disposed between the spring-loaded handle and the sample.

In some embodiments, the techniques described herein relate to a sample mount, further including a rotational actuator configured to rotate the sample about an axis normal to a front face of the sample.

In some embodiments, the techniques described herein relate to a sample mount, wherein the spring-loaded handle is disposed through the back wall.

In some embodiments, the techniques described herein relate to a sample mount, further including a first edge and a second edge, wherein the first edge extends from the first top face and the second edge extends from the second top face, the first edge and the second edge configured to align the sample.

In some embodiments, the techniques described herein relate to a sample mount for electron backscatter diffraction data acquisition, including: a front surface extending from a bottom surface of the sample mount, the front surface including: a first exterior face; an interior face oriented at a 70-degree angle relative to the bottom surface; an opening extending through the front surface such that the sample mount presents an open top for an unimpeded path from an SEM pole piece to a sample; a first top face and a second top face separated by the opening; a receiving area for receiving the sample; and a spring-loaded handle configured to press the sample against the interior face of the front surface such that a front surface of the sample is flush with the interior face, thereby presenting a planar surface to the SEM pole piece; and a rotational actuator coupled to the spring-loaded handle configured to rotate the sample.

In some embodiments, the techniques described herein relate to a sample mount, wherein the sample projects above the first top face and the second top face when disposed in the receiving area.

In some embodiments, the techniques described herein relate to a sample mount, wherein the rotational actuator is configured to rotate the sample about a normal of the front face of the sample.

In some embodiments, the techniques described herein relate to a sample mount, wherein the rotational actuator is integral with the spring-loaded handle.

In some embodiments, the techniques described herein relate to a sample mount, wherein the rotational actuator is configured to be electronically controlled by a computer system.

In some embodiments, the techniques described herein relate to a sample mount, wherein the rotational actuator is a stepper motor.

In some embodiments, the techniques described herein relate to a sample mount, further including at least one spacer disposed between a back face of the sample and the spring-loaded handle.

In some embodiments, the techniques described herein relate to a sample mount, wherein the spring-loaded handle further includes a twist-lock for maintaining a compressive force on the sample.

In some embodiments, the techniques described herein relate to a multi-sample mount for electron backscatter diffraction including: a plurality of sample mounts disposed adjacent to one another, each of the plurality of sample mounts including: a front surface extending from a bottom surface of the sample mount, the front surface including: an exterior face; an interior face oriented at a 70-degree angle relative to the bottom surface; an opening extending through the front surface such that the sample mount presents an open top for an unimpeded path from an SEM pole piece to a sample; a receiving area for receiving the sample; and at least one spring-loaded handle configured to press the sample against the interior face of the front surface such that a front face of the sample is flush with the interior face, thereby presenting a planar surface to the SEM pole piece; wherein pushing the sample against the interior face places the sample at the 70-degree angle relative to the bottom surface.

In some embodiments, the techniques described herein relate to a multi-sample mount, wherein the multi-sample mount is configured to be translated within an SEM chamber to successively analyze the sample in each of the plurality of sample mounts.

In some embodiments, the techniques described herein relate to a multi-sample mount, wherein the at least one spring-loaded handle includes a spring-loaded handle for each of the plurality of sample mounts.

In some embodiments, the techniques described herein relate to a multi-sample mount, wherein at least one of the plurality of sample mounts includes at least one spacer disposed between a back face of the sample and a distal end of the spring-loaded handle.

In some embodiments, the techniques described herein relate to a multi-sample mount, wherein at least one of the plurality of sample mounts includes: a first edge and a second edge, wherein the first edge extends from a first top face of the front surface and the second edge extends from a second top face of the front surface, the first edge and the second edge configured to align the sample.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present disclosure will be apparent from the following detailed description of the embodiments and the accompanying drawing figures.

BRIEF DESCRIPTION OF THE DRAWING FIGURES

Embodiments of the present disclosure are described in detail below with reference to the attached drawing figures, wherein:

FIG. 3 illustrates a multi-sample mount for some embodiments.

Figure 1:
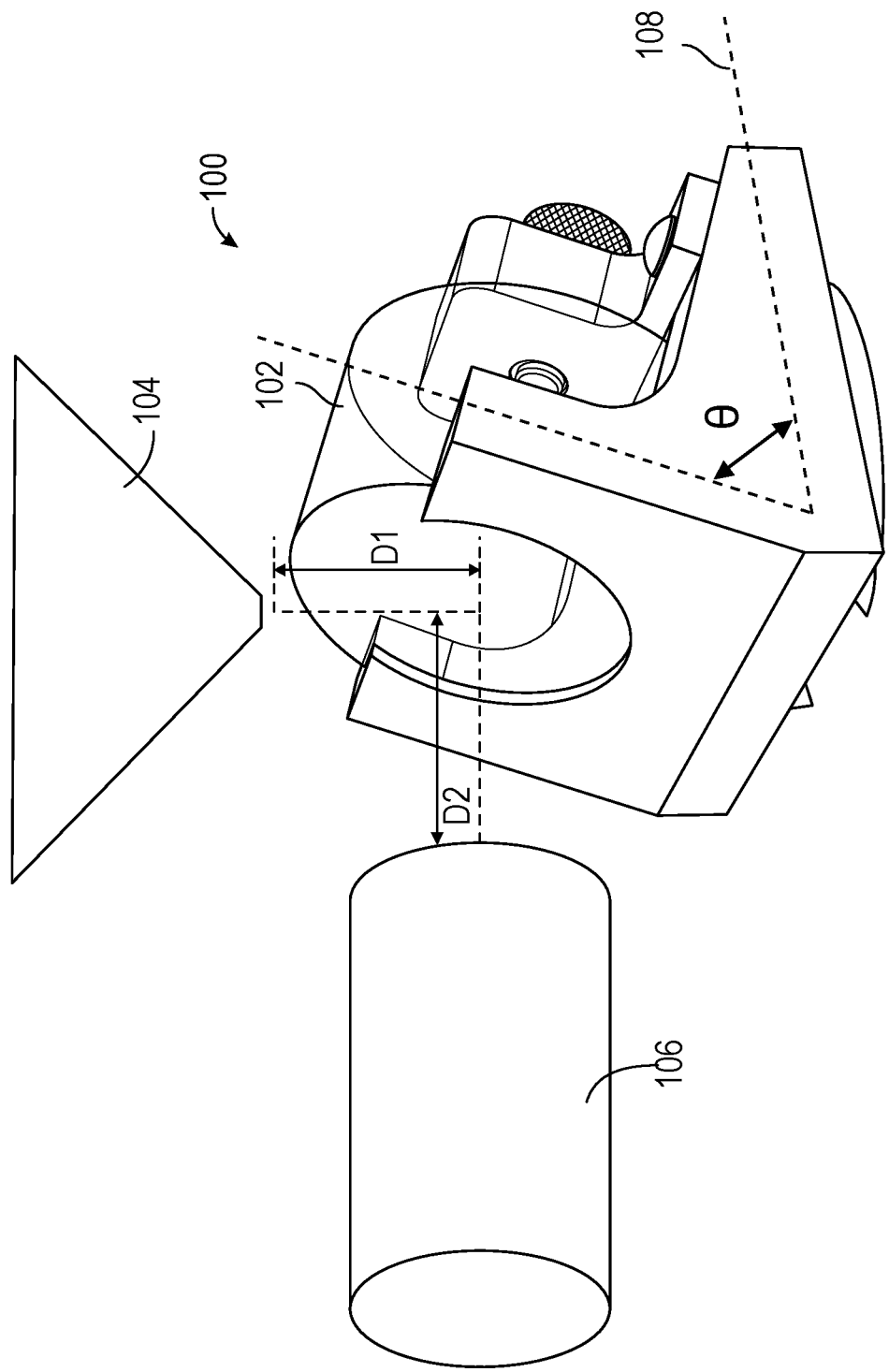
FIG. 1 illustrates a sample mount within a scanning electron microscope chamber for some embodiments.

The drawing figures do not limit the present disclosure to the specific embodiments disclosed and described herein. The drawings are not necessarily to scale, emphasis instead being placed upon clearly illustrating the principles of the present disclosure.

DETAILED DESCRIPTION

The subject matter of the present disclosure is described in detail below to meet statutory requirements; however, the description itself is not intended to limit the scope of claims. Rather, the claimed subject matter might be embodied in other ways to include different steps or combinations of steps similar to the ones described in this document, in conjunction with other technologies. Minor variations from the description below will be understood by one skilled in the art and are intended to be captured within the scope of the claims. Terms should not be interpreted as implying any particular ordering of various steps described unless the order of individual steps is explicitly described.

The following detailed description references the accompanying drawings that illustrate specific embodiments in which the present disclosure can be practiced. The embodiments are intended to describe aspects of the present disclosure in sufficient detail to enable those skilled in the art to practice the present disclosure. Other embodiments can be utilized and changes can be made without departing from the scope of the present disclosure. The following detailed description is, therefore, not to be taken in a limiting sense. The scope of the present disclosure is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

System Overview

Embodiments of the present disclosure are generally directed to sample mounts for electron backscatter diffraction (EBSD) data acquisition for holding the sample at exactly or near-exactly a 70-degree angle with respect to the horizontal. The sample mount may comprise a spring-loaded handle that may push and hold the sample against a front, interior face of the sample mount to orient the sample at the 70-degree angle, which allows for an optimal, high contrast capture of EBSD. The interior face may be flat such that the sample mount may be flush with the interior face to present a planar face for the EBSD data acquisition. The sample mount may also comprise a rotational actuator for rotating the sample about the normal/z-axis, which may eliminate the need to rotationally post-process the EBSD data. The sample mount may hold one or more samples. When the sample mount holds more than one sample, the sample mount may be moved within the SEM chamber to allow for successive sample acquisition.

FIG. 1 illustrates a sample mount for electron backscatter diffraction within a scanning electron microscope for some embodiments. In some embodiments, a system for electron backscatter diffraction comprises sample mount 100 configured to hold a sample 102, a SEM pole piece 104, and a EBSD detector 106. Sample mount 100 may be configured to hold sample 102 at a 70-degree angle (θ) relative to horizontal 108. In some embodiments, sample mount 100 may be positioned such that SEM pole piece 104 may be within a range of 4-15 millimeters from sample 102. As previously discussed, placing the sample 102 between 4-15 millimeters from SEM pole piece 104 produces an optimal output image for analysis of sample 102. In some embodiments, EBSD detector 106 may be oriented parallel to the mounting surface of the scanning electron microscope such that EBSD detector 106 may observe electrons diffracting through the sample 102. In some embodiments, EBSD detector 106 is oriented at an angle below horizontal with respect to SEM pole piece 104. It will be appreciated that each of sample mount 100, sample 102, SEM pole piece 104, and EBSD detector 106 may be located within an SEM chamber (not shown).

In some embodiments, sample 102 may comprise an object suspended in a resin. In some embodiments, sample 102 may comprise a front surface polished for EBSD. In some embodiments, sample 102 may comprise a plurality of objects suspended in resin. In some embodiments, sample 102 may be configured to have a cubic prism volume, a rectangular prism volume, a cylindrical volume, a spherical volume, a pyramidal volume, or any other such volume. Generally, sample 102 may be any sample that may be analyzed using EBSD and may take any geometry.

In some embodiments, sample mount 100 has an open top such that sample 102 projects above the top surface, and an unimpeded path between SEM pole piece 104 and sample 102 is provided. Accordingly, in contrast to prior sample mounts, the material of sample mount 100 does not impede the path from SEM pole piece 104 to sample 102. In some embodiments, the unimpeded path between SEM pole piece 104 and sample 102 may be of a distance D1 between SEM pole piece 104 and sample 102. For example, distance D1 may be any distance within the range of 4-15 millimeters. It is contemplated, however, that distance D1 may comprise any distance that allows for EBSD without departing from the scope of the present disclosure. Likewise, the opening through front surface 204, may provide an unimpeded path from EBSD detector 106 to sample 102. The unimpeded path between EBSD detector 106 and sample 102 may have a distance D2 that may be the same distance as distance D1. In some embodiments, D2 may be a different distance than D1.

Sample Mount

Figure 2A:
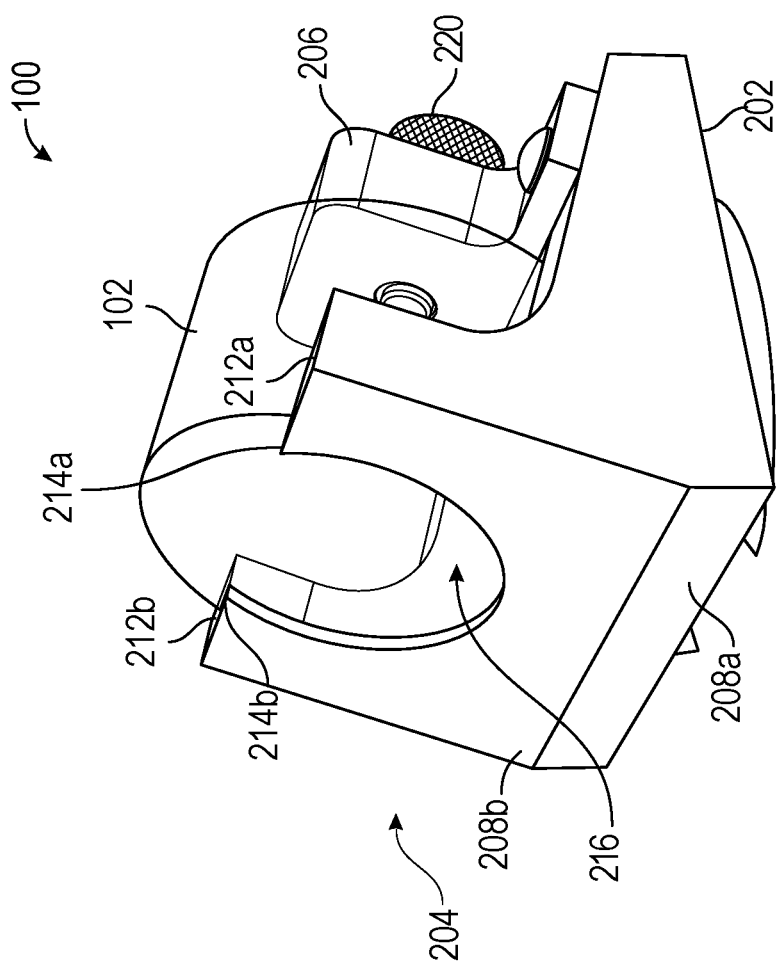
FIG. 2A illustrates the sample mount in a front perspective view for some embodiments.
Figure 2B:
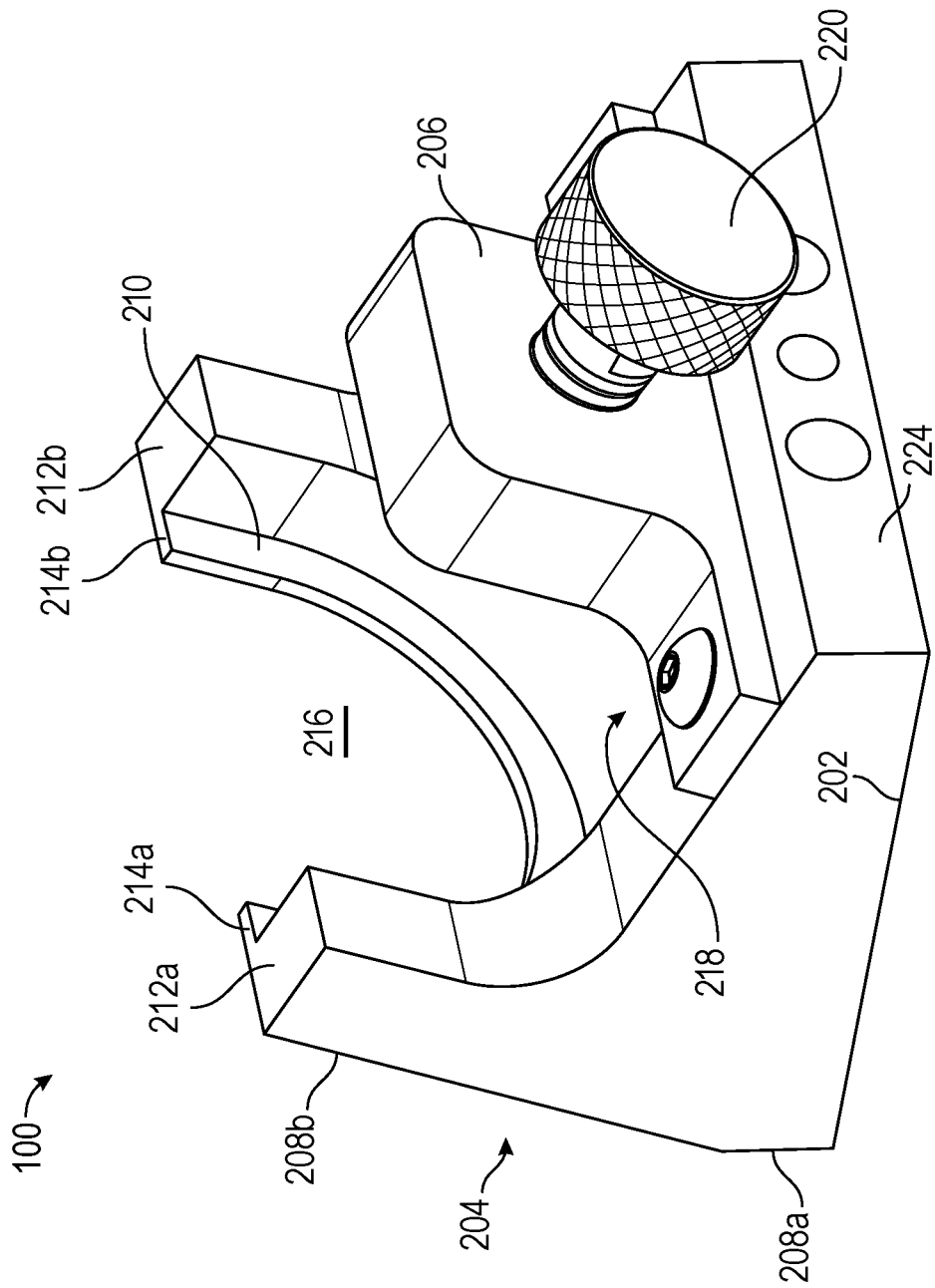
FIG. 2B illustrates the sample mount in a rear perspective view for some embodiments.

FIG. 2A illustrates sample mount 100 with sample 102 mounted therein for some embodiments. In some embodiments, sample mount 100 may comprise a bottom surface 202, a front surface 204, and a back wall 206. The front surface 204 may comprise a first exterior face 208a, a second exterior face 208b, an interior face 210 (as depicted in FIG. 2B), a first top face 212a, and a second top face 212b. Each face 212a, 212b may comprise an edge 214a, 214b projecting inwards towards a center of an opening 216 that extends through an upper portion of second exterior face 208b, dividing first top face 212a and second top face 212b. Front surface 204 may extend upward from bottom surface 202. Bottom surface 202 may be a flat surface and may be coplanar with the horizontal 108. In some embodiments, bottom surface 202 may comprise contours and/or features configured to interface with SEM mounting hardware 234 (depicted in FIG. 2C). For example, bottom surface 202 may comprise a plurality of bolts for screwing into a threaded hole for mounting in the SEM.

Figure 2C:
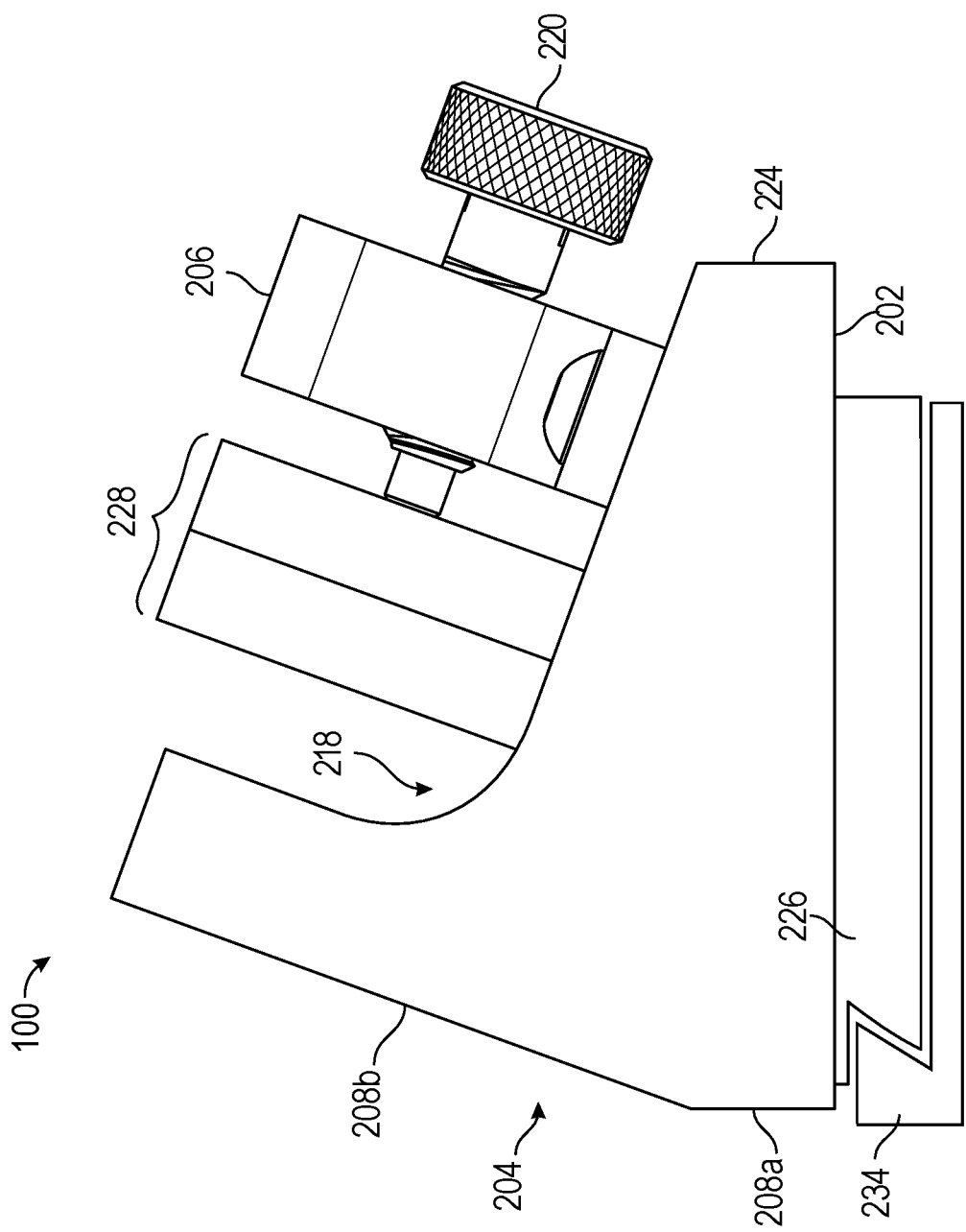
FIG. 2C illustrates the sample mount in a side view for some embodiments.

In some embodiments, sample mount 100 may have a tilt of 70-degrees. By providing sample mount 100 with exactly a 70-degree tilt built in, it may be guaranteed that the sample 102 is always at the optimal 70-degree angle, and the operator may not have to make adjustments to the sample mount 100 to ensure the accuracy of the angle. While embodiments of the present disclosure are discussed with respect to sample mount 100 having a 70-degree tilt, it will be appreciated that sample mount 100 may be formed a tilt of any degree without departing from the scope hereof. For example, an SEM machine may have a tilted surface on which the sample mount 100 is mounted, and sample mount 100 may be formed with the appropriate angle to achieve the 70-degree angle relative to SEM pole piece 104. In some embodiments, the tilt may be relative to a mounting surface (which may coincide with a horizontal) of an SEM sensor chamber. In some embodiments, the tilt may be relative to an SEM pole piece 104. In some embodiments, the tilt may be relative to mount 226 (as depicted in FIG. 2C).

In some embodiments, sample mount 100 may comprise first top face 212a and second top face 212b. In some embodiments, each top face 212a, 212b is oriented at a 70-degree angle with respect to horizontal 108. In some embodiments, sample 102 may project above both first top face 212a and second top face 212b. In some embodiments, first top face 212a and second top face 212b are separated by opening 216. First top face 212a and second top face 212b may comprise the same or different heights. First edge 214a and second edge 214b may extend inwardly from top faces 212a, 212b. In some embodiments, first edge 214a and second edge 214b may be configured to orient or align sample 102 at a 90-degree angle with respect to EBSD detector 106. In some embodiments, first edge 214a and second edge 214b may be configured to guide sample 102 into sample mount 100 as sample 102 is placed within sample mount 100. First edge 214a and edge 214b may also form a portion of interior face 210.

In some embodiments, front surface 204 may comprise first exterior face 208a, second exterior face 208b, and interior face 210. In some embodiments, first exterior face 208a extends from bottom surface 202 and transitions into second exterior face 208b. In some embodiments, first exterior face 208a may be perpendicular to bottom surface 202, and second exterior face 208b may form a 70-degree angle with respect to horizontal 108. In some embodiments, front surface 204 comprises a single exterior face that may be oriented at 70 degrees relative to the horizontal 108.

Interior face 210 of front surface 204 is shown in FIG. 2B. In some embodiments, interior face 210 may be configured to prevent sample 102 from being pushed out of sample mount 100. For example, interior face 210 may project over a front surface of sample 102 such that interior face 210 may provide a hard stop that prevents further translation of sample 102 (see FIGS. 1 and 2A). Interior face 210 may be a flat face against which a front face of sample 102 may be held to ensure that sample 102 is at the required 70-degree angle. Accordingly, interior face 210 may likewise be oriented at the 70-degree angle relative to the bottom surface 202. In some embodiments, interior face 210 may be separated into individual tabs or elements such that interior face 210 is discontinuous configured to prevent sample 102 from being pushed out of sample mount 100. In some embodiments, interior face 210 is substantially U-shaped and may comprise a circumferential edge configured to prevent sample 102 from being pushed out of sample mount 100. In some embodiments, interior face 210 abuts against sample 102, providing a hard stop such that sample 102 may not be moved past interior face 210 and thereby presenting a planar surface to the SEM pole piece 104.

In some embodiments, front surface 204 may comprise opening 216 extending therethrough as discussed above. In some embodiments, opening 216 may extend through second exterior face 208b of front surface 204 such that sample mount 100 presents an open top with no circumference or perimeter. As discussed previously, providing a sample mount 100 with an open top allows for an unimpeded path between SEM pole piece 104 and sample 102.

In some embodiments, opening 216 transitions into a receiving area 218. In some embodiments, receiving area 218 is an open portion of sample mount 100 where sample 102 is held during the SEM process. In some embodiments, receiving area 218 is bounded by front surface 204 and back wall 206. In some embodiments, receiving area 218 may be located rearwards from front surface 204. In some embodiments, receiving area 218 may be oriented to form a 70-degree angle relative to horizontal 108 such that sample 102 is at 70-degrees when placed in receiving area 218. In some embodiments, receiving area 218 may be a recessed portion of sample mount 100 such that sample 102 may be inserted into receiving area 218. In some embodiments, receiving area 218 may be semi-cylindrical. In some embodiments, sample 102 may be cylindrical and receiving area 218 may be semi-cylindrical to hold sample 102. Generally, the geometry of receiving area 218 may match that of sample 102. For example, receiving area 218 may be rectangular, cubic, or any other geometric shape. In some embodiments, receiving area 218 may be oriented at an angle of 70-degrees with respect to SEM pole piece 104.

In some embodiments, receiving area 218 may be configured to receive any sample for electron backscatter diffraction data acquisition. In some embodiments, receiving area 218 and/or sample 102 may comprise mechanical gripping features such as spikes, burrs, knurling, diamond plate, low-grit sandpaper, high-grit sandpaper, adhesive, holes and corresponding protrusions, ridges, perforations, interlocking teeth, form fitted surfaces, or any other mechanical gripping feature configured to provide an increased resistance to rotation of sample 102. In some embodiments, sample 102 may be held in receiving area 218 by friction fitting and/or other forms of fastening. In some embodiments, spring-loaded handle 220 may be absent and sample 102 may rest on back wall 206. In some embodiments, back wall 206 is adjustable to press sample 102 against interior face 210. In some embodiments, the surface of receiving area 218 may comprise any combination of the mechanical gripping features described above. For example, receiving area 218 may be lined with adhesive to adhere sample 102 to receiving area 218 such that sample 102 may not be rotated or removed from receiving area 218 easily.

In some embodiments, receiving area 218 may be lined with grooves configured to interface with sample 102 such that receiving area 218 may resist any movement of sample 102 along the length of receiving area 218. In some embodiments, the receiving area 218 may be configured to have a higher coefficient of friction than smooth metal surfaces, such as those commonly analyzed for EBSD. In some embodiments, receiving area 218 may be gnarled to provide a resisting force to movement of sample 102 along a longitudinal axis of the sample mount 100.

As described above, sample mount 100 may comprise back wall 206 disposed opposite of interior face 210. In some embodiments, back wall 206 may be formed integrally with sample mount 100. In some embodiments, back wall 206 may be removably attachable to sample mount 100 as shown. In some embodiments, back wall 206 may be coupled to a rear portion of 100 using bolts, screws, rivets, anchors, friction fitting, adhesive, clamps, vices, welding, cold welding, vacuum fit, or any other fastening method. In some embodiments, back wall 206 may comprise the same or a similar material as sample mount 100.

In some embodiments, back wall 206 may comprise a bore therethrough and oriented normal to interior face 210. In some embodiments, sample mount 100 comprises spring-loaded handle 220 disposed through the bore in back wall 206. In some embodiments, spring-loaded handle 220 comprises a threaded rod, and the bore of back wall 206 may be threaded, for example, such that a user can thread spring-loaded handle 220 to apply a compressive force to sample 102. In some embodiments, spring-loaded handle 220 may be removed to accommodate larger samples. In some embodiments, back wall 206 may comprise any material capable of supporting spring-loaded handle 220 such as, polypropylene, polyvinyl chloride, polycarbonate, brass, steel, aluminum, iron, ceramics, or any other material.

In some embodiments, spring-loaded handle 220 drives sample 102 against interior face 210 such that sample 102 may be oriented at an angle of 70-degrees with respect to the horizontal 108. Accordingly, in some embodiments, spring-loaded handle 220 may be oriented at a 70-degree angle with respect to horizontal 108. In some embodiments, spring-loaded handle 220 may be oriented perpendicularly to second exterior face 208b.

In some embodiments, spring-loaded handle 220 may comprise a biased spring mechanism configured to apply a bias to sample 102. In some embodiments, spring-loaded handle 220 is a twist-lock handle such that spring-loaded handle 220 does not need to be moved towards interior face 210 to press sample 102 against interior face 210. In some embodiments, spring-loaded handle 220 may comprise a twist-lock mechanism configured to lock spring-loaded handle 220 in an extended, compressed, or any state of extension or compression there between. In some embodiments, the twist-lock mechanism may be configured to maintain a compressive force on a sample present in receiving area 218. In some embodiments, the twist-lock mechanism may be configured to prevent sample 102 from moving while present in receiving area 218. In some embodiments, the twist-lock mechanism may be configured to prevent spring-loaded handle 220 from extending into receiving area 218 such that a sample may be placed into receiving area 218 without obstruction. In some embodiments, spring-loaded handle 220 may comprise a twist-lock mechanism configured to hold spring-loaded handle 220 in an open position when spring-loaded handle 220 is twisted in a first direction (e.g., clockwise) and configured to release spring-loaded handle 220 when spring-loaded handle 220 is twisted in a second direction (e.g., counter-clockwise). In some embodiments, the twist lock mechanism may be a threaded locking mechanism, a pawl and ratchet, a quarter turn locking mechanism, a quick-release twist-lock, a sliding lock, a friction locking mechanism, or any other such locking mechanism.

Removing the need for an operator to move spring-loaded handle 220 may reduce the likelihood that sample 102 is not correctly placed against interior face 210. In some embodiments, spring-loaded handle 220 may comprise a biased handle comprising a threaded screw, a linear actuator, a rack and pinion, a hydraulic piston, a hydraulic cylinder, a pneumatic piston, a pneumatic cylinder, a weighted pendulum, a magnetic driver, a conical spring, a circular spring, an elastic compression band, a leaf spring, or any other such mechanical biasing element. In some embodiments, spring-loaded handle 220 may be disposed through back wall 206. In some embodiments, spring-loaded handle 220 may be oriented to provide a compressive force along a central axis of receiving area 218.

In some embodiments, sample 102 may be held completely flat against interior face 210 by spring-loaded handle 220. For example, interior face 210 may be oriented at a 70-degree tilt and sample 102 may be pushed against interior face 210 such that a front surface of sample 102 is oriented at the 70-degree tilt with respect to bottom surface 202. In some embodiments, interior face 210 comprises a circular geometry encircling at least a portion of opening 216. In some embodiments, interior face 210 provides an abutment surface that may hold sample 102 substantially flat, thereby presenting a planar face to SEM pole piece 104 and EBSD detector 106 when spring-loaded handle 220 presses sample 102 to be flush with interior face 210.

In some embodiments, spring-loaded handle 220 may further comprise distal end 222 (FIG. 2D) configured to abut with a back surface of sample 102 such that spring-loaded handle 220 pushes distal end 222 sample 102 into interior face 210. Distal end 222 may be integral with 220 and/or may be a separate component. In some embodiments, distal end 222 is removably coupled to spring-loaded handle 220. In some embodiments, distal end 222 may further comprise a coupling mechanism for coupling to spring-loaded handle 220. In some embodiments, the coupling mechanism may comprise a gimballed mount, a dual hinge, a knuckle joint, a turn-buckle joint, a pin joint, a prismatic joint, a ball joint, a cotterpin joint, a bolted joint, or any other such coupling mechanism. In some embodiments, distal end 222 and sample 102 may comprise mechanical gripping features such as spikes, burrs, knurling, diamond plate, low-grit sandpaper, high-grit sandpaper, adhesive, holes and corresponding protrusions, ridges, perforations, interlocking teeth, or any other mechanical gripping feature configured to provide an increased resistance to rotation of sample 102 when distal end 222 pushes sample 102.

In some embodiments, distal end 222 may comprise a three degrees of freedom (DoF) ball joint. In some embodiments, distal end 222 may be configured to deflect according to an angle of a surface of a sample such that distal end 222 pushes sample 102 according to a normal of front surface 204. In some embodiments, distal end 222 may be configured to push sample 102 flat against interior face 210 such that sample 102 may have at least one SEM-observable surface oriented at a 70-degree angle with respect to bottom surface 202.

As shown in FIG. 2B, sample mount 100 may further comprise a back surface 224 extending upward from bottom surface 202. In some embodiments, back surface 224 may be configured to be mounted to SEM mounting hardware such that sample mount 100 may be fixed to the SEM. For example, back surface 224 may comprise one or more holes for receiving a fastener therein. Back surface 224 may be perpendicular to bottom surface 202. In some embodiments, back surface 224 may form any angle with bottom surface 202. In some embodiments, back surface 224 may be configured to mount to the SEM chamber. For example, back surface 224 may comprise a threaded channel for interfacing with a threaded mounting element of the SEM chamber.

FIG. 2C depicts a side view of sample mount 100 for some embodiments. In some embodiments, the sample mount 100 may be coupled to a mount 226 that, in turn, may be coupled to a SEM. Mount 226 may be coupled to bottom surface 202. In some embodiments, mount 226 may comprise a plurality of fastening holes (not shown) for coupling to an SEM sensor chamber. In some embodiments, the plurality of fastening holes may be disposed on any surface of sample mount 100. In some embodiments, mount 226 may comprise dovetail style mounting hardware, bolt-on mounting hardware, interlocking tabs mounting hardware, clamp mounting hardware, screw mounting hardware, or any other mounting hardware for coupling sample 102 to the SEM chamber. In some embodiments, mount 226 may be integrated into sample mount 100. In some embodiments, back surface 224 may be configured to mount to a SEM. For example, back surface 224 may comprise a plurality of mounting holes for interfacing with mounting hardware on a SEM.

In some embodiments, bottom surface 202, first top face 212a, second top face 212b, front surface 204, first exterior face 208a, second exterior face 208b, interior face 210 form a single unitary body for sample mount 100. Back wall 206 and mount 226 may be mechanically fastened to the unitary body. In some embodiments, back wall 206 and mount 226 are integral with bottom surface 202, first top face 212a, second top face 212b, and front surface 204. In some embodiments, spring-loaded handle 220 may be disposed through the unitary body.

As shown in FIG. 2C, in some embodiments, sample mount 100 comprises one or more spacers 228 may be configured to accommodate an uneven back surface of sample 102 such that the uneven back surface does not affect the angle of sample 102 for electron backscatter diffraction data acquisition. Spacers 228 may comprise an elastic and/or malleable material such as silicone, rubber, and/or any other such elastic/malleable material. For example, the uneven back surface of sample 102 may form a 40-degree angle with respect to a front surface of sample 102. Spacers 228 may comprise a rubber material such that at least one of spacers 228 deforms to a 50-degree angle with respect to the front surface of sample 102, thereby preventing any change in angle of sample 102 with respect to the horizontal 108.

In some embodiments, spacers 228 may be configured to fit within receiving area 218. In some embodiments, spacers 228 may have the same cross-sectional shape as sample 102. For example, spacers 228 may be formed as discs when sample 102 has a circular cross-section. In some embodiments, plurality of spacers 228 may abut against spring-loaded handle 220, and spring-loaded handle 220 presses spacers 228 into sample 102. In some embodiments, spacers 228 may be configured to accommodate any size of sample placed in receiving area 218. For example, receiving area 218 may have an arbitrary length of 100 millimeters. Sample 102 may have an arbitrary length of 50 millimeters. Spacers 228 may have an arbitrary length of 25 millimeters. Thus, spacers 228 may accommodate for a difference in size between sample 102 and receiving area 218.

Figure 2D:
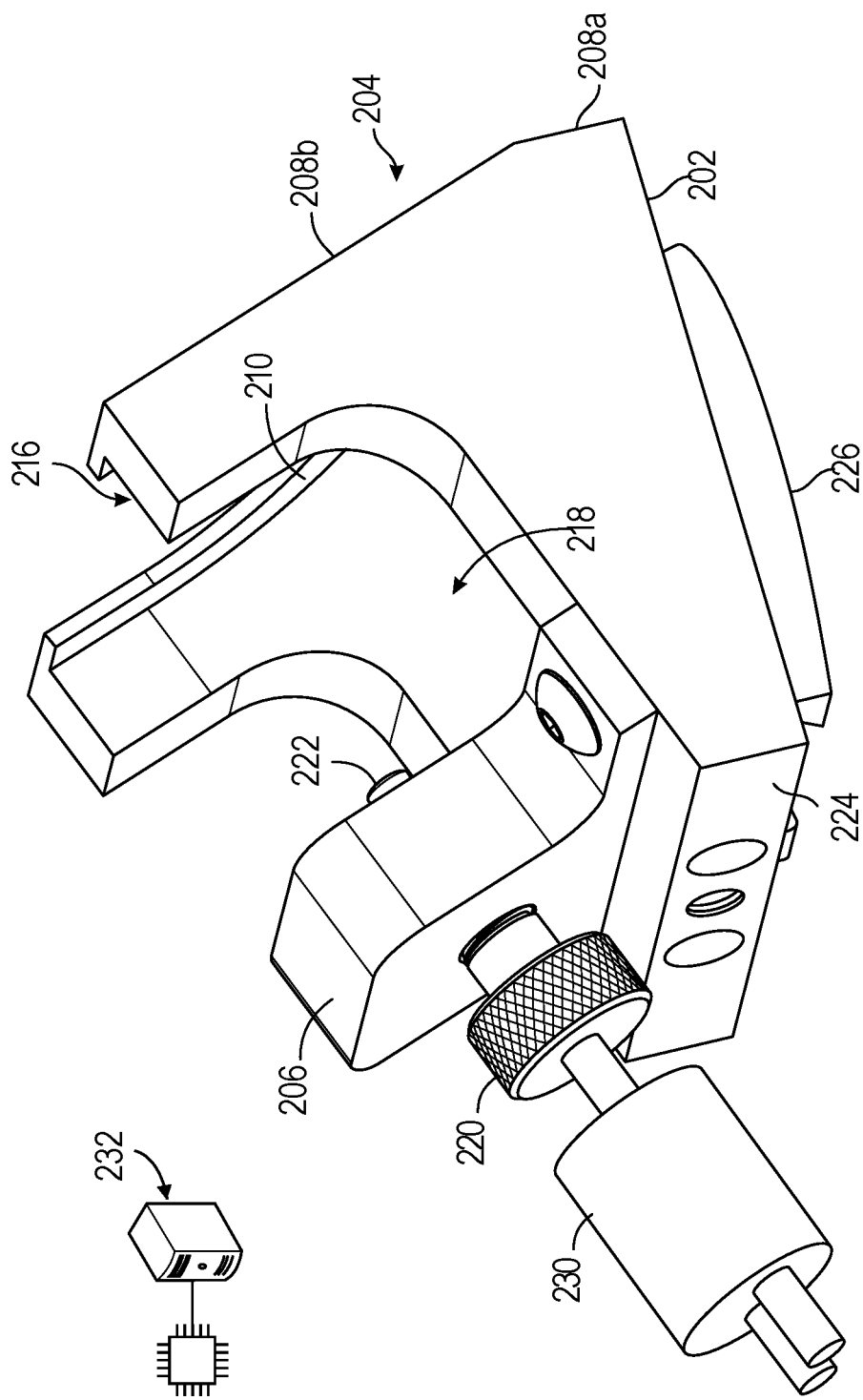
FIG. 2D illustrates a sample mount with a rotational actuator in a side view for some embodiments.

FIG. 2D depicts a rear perspective view of sample mount 100 showing a rotational actuator 230 for rotating sample 102 for some embodiments. As previously discussed, after data acquisition, the EBSD data may need to be rotated in order to orient the data with the sample. However, the data may also be oriented with the sample by rotating the sample after EBSD data acquisition. In some embodiments, sample 102 may be rotated to orient the sample with respect to the EBSD data without being required to rotate the EBSD data as a part of post processing the data. In some embodiments, rotational actuator 230 may be an electric motor that may be communicatively coupled to an electronic control system. The electronic control system may operate the electric motor to rotate sample 102. In some embodiments, rotational actuator 230 may be a mechanical rotation mechanism such as a ratchet, an electric motor, a threaded screw, a freely rotating rod, a bolt, a bearing, a ball-bearing, a gimbal, a high-resolution stepper motor, or any other rotation mechanism.

In some embodiments, rotational actuator 230 may be electronically connected to a computer system 232. Computer system 232 may comprise at least one controller, a transmitter, a receiver, a server, a processor, a memory, and any components necessary for electrically communicating information between components and connecting to a local network and the Internet via a wired or wireless communication medium. In some embodiments, the computer system 232 may be a mobile device such as a laptop, cellphone, tablet, or any other such mobile computer system. In some embodiments, the computer system 232 may include an input/output port such that external electronic devices may be communicatively connected to the computer system. In some embodiments, the computer system 232 may be configured to be electronically connected to external devices such that the computer system 232 provides an electric current to the external devices. In some embodiments, the computer system 232 may be wirelessly connected to external devices such that the computer system 232 may transmit computer readable information, control signals, or any other such wireless transmission. Computer system 232 may comprise one or more non-transitory computer-readable media storing computer-executable instructions that, when executed by at least one processor, control the operations of rotational actuator 230 and/or sample mount 100.

In some embodiments, the computer system 232 may be configured to send control information to rotational actuator 230 causing rotational actuator 230 to actuate and rotate sample 102 present in receiving area 218. Likewise, it is contemplated that the computer system may control spring-loaded handle 220. For example, spring-loaded handle 220 may be an electronic actuator capable of providing a compressive force to sample 102. In some embodiments, the computer system may issue commands to spring-loaded handle 220 to apply or remove a compressive force to sample 102. In some embodiments, the computer system may use a feedback loop to control the amount of force applied to sample 102 such that sample 102 may resist being warped, altered, or otherwise damaged.

Multi-Sample Mount

FIG. 3 illustrates a multi-sample mount 300 for some embodiments of the present disclosure. Multi-sample mount 300 may allow for multiple samples 102 to be analyzed successively within the SEM sensor chamber. In some embodiments, multi-sample mount 300 may comprise a first sample region 302a adjacent to a second sample region 302b adjacent to a third sample region 302c. Each sample region 302a, 302b, 302c may be substantially similar to sample mount 100. Each sample region 302a, 302b, and 302c may comprise any combination of the features of sample mount 100 as described above. Additionally, multi-sample mount 300 and each sample region 302a, 302b, and 302c may comprise additional features not illustrated in the figures without departing from the scope of the present disclosure. In some embodiments, a single bottom surface connects sample region 302a, sample region 302b, and sample region 302c. While three sample regions 302a, 302b, 302c are illustrated, it will be appreciated that a multi-sample mount 300 may comprise two sample regions or more than three sample regions without departing from the scope hereof.

In some embodiments, multi-sample mount 300 may be configured to receive a first sample 304a, a second sample 304b, and a third sample 304c in sample region 302a, sample region 302b, and sample region 302c, respectively. In some embodiments, each sample 304a, 304b, and 304c differ from each other. For example, first sample 304a may comprise a rectangular prism, second sample 304b may comprise a cylinder, and 304c may be a triangular prism. It is noted that each sample 304a, 304b, and 304c may contain any number and/or variety of objects for EBSD without departing from the scope of the present disclosure.

In some embodiments, each sample region 302a, 302b, and 302c comprises a first top face and second top face substantially similar to first top face 212a and second top face 212b as described above. In some embodiments, sample region 302a, 302b, and 302c may have alternate embodiments of the first top face and the second top face. For example, sample region 302a may comprise a first top face forming an angle of 70-degrees with respect to horizontal 108, sample region 302b may comprise a second top face forming an angle of 20-degrees with respect to horizontal 108, and sample region 302c may comprise a first top face and a second top face parallel to horizontal 108.

In some embodiments, first sample region 302a may comprise a first receiving area corresponding to receiving area 218 as described above. In some embodiments, second sample region 302b comprises a second receiving area corresponding to receiving area 218 as described above. In some embodiments, third sample region 302c comprises a third receiving area corresponding to receiving area 218 as described above. In some embodiments, the first receiving area is configured to receive first sample 304a, the second receiving area is configured to receive second sample 304b, and the third receiving area is configured to receive third sample 304c.

In some embodiments, each sample region 302a, 302b, and 302c may comprise a spring-loaded handle corresponding to spring-loaded handle 220 as described above. In some embodiments, each sample region 302a, 302b, and 302c may comprise different embodiments of spring-loaded handle 220. For example, sample region 302a may comprise a threaded rod, sample region 302b may comprise a biased spring, and sample region 302c may comprise an elastic band coupled to a biased handle.

In some embodiments, each sample region 302a, 302b, and 302c may comprise a rotational actuator corresponding to rotational actuator 230 as described above. In some embodiments, sample region 302a may comprise a different embodiment of rotational actuator 230 than sample region 302b or sample region 302c. For example, sample region 302a may comprise a rotational actuator configured to be electronically controlled whereas sample region 302b and sample region 302c comprise a manually operated rotational actuator. In some embodiments, each sample region 302a, 302b, and 302c may comprise a different rotational actuator.

In some embodiments, first sample region 302a may differ from second sample region 302b and third sample region 302c. For example, first sample region 302a may be configured to hold rectangular samples whereas second sample region 302b and third sample region 302c may be configured to hold cylindrical samples. In some embodiments, each of first sample region 302a, second sample region 302b, and third sample region 302c may differ from each other. For example, first sample region 302a may comprise gripping features, second sample region 302b may comprise plurality of spacers 228, and third sample region 302c may comprise rotational actuator 230.

In some embodiments, multi-sample mount 300 may be configured to translate lengthwise within an SEM sensor chamber. In some embodiments, multi-sample mount 300 may be configured to attach to a translating mechanism such that multi-sample mount 300 may be translated laterally. In some embodiments, multi-sample mount 300 may be mounted on rails configured to accommodate translational motion. In some embodiments, translating multi-sample mount 300 lengthwise presents at least one of first sample 304a, second sample 304b, and third sample 304c to SEM pole piece 104. In some embodiments, the translating mechanism may be slides, rails, wheels, rollers, one or more linear actuators, a rack and pinion, a rack and worm gear, or any other translating mechanism.

In some embodiments, multi-sample mount 300 may translate incrementally to present first sample 304a, second sample 304b, and third sample 304c in succession. In some embodiments, multi-sample mount 300 may be translated such that first sample 304a, second sample 304b, and third sample 304c may be presented in any order. In some embodiments, multi-sample mount 300 may be configured to translate laterally in a single direction. For example, multi-sample mount 300 may translate only from left to right.

In some embodiments, multi-sample mount 300 may be configured to translate in any direction to accommodate any position within an SEM chamber. For example, multi-sample mount 300 may be mounted to linear motion systems to move multi-sample mount 300 through 3-dimensional space. In some embodiments, multi-sample mount 300 may be configured to rotate in any direction. For example, multi-sample mount 300 may be mounted to a gimbal such that multi-sample mount 300 may rotate according to yaw, pitch, and roll, or any combination thereof.

In some embodiments, first sample region 302a, second sample region 302b, and third sample region 302c may be configured in a row, a stacked arrangement, a pillar, a stop-light configuration, or any other arrangement such that SEM pole piece 104 may have direct access to at least one sample at a time. In some embodiments, first sample 304a may contain multiple objects such that the SEM pole piece may be oriented to observe at least one of the multiple objects within first sample 304a. In some embodiments, first sample 304a may be configured to present at least one of the multiple objects to the SEM pole piece at a time. For example, first sample 304a may hold 3 objects arranged in a triangle pattern such that first sample 304a may be rotated to put at least one of the 3 objects closest to SEM pole piece 104. In some embodiments, rotational actuator 230 may be configured to rotate the first sample 304a to reveal one of the multiple objects within first sample 304a at a time.

In some embodiments, multi-sample mount 300 may be moved such that one sample is presented to SEM pole piece 104 at a time. Thus, removing a sample and inserting a different sample may not be required. For example, multi-sample mount 300 may be moved to present first sample 304a then multi-sample mount 300 may be moved to present second sample 304b. In some embodiments, multi-sample mount 300 may be configured to rotate such that more than one sample may be presented to SEM pole piece 104.

Although the present disclosure has been described with reference to the embodiments illustrated in the attached drawing figures, it is noted that equivalents may be employed and substitutions made herein without departing from the scope of the present disclosure as recited in the claims.

Having thus described various embodiments of the present disclosure, what is claimed as new and desired to be protected by Letters Patent includes the following:

1. A sample mount for electron backscatter diffraction data acquisition, comprising:
   a front surface extending from a bottom surface of the sample mount, the front surface comprising:
     an exterior face;
     an interior face oriented at an angle relative to the bottom surface;
     an opening extending through the front surface such that the sample mount presents an open top for an unimpeded path from an SEM pole piece to a sample,
   wherein the sample is configured to be held flush against the interior face of the front surface such that a front face of the sample is flush with the interior face, thereby presenting a planar surface to the SEM pole piece; and a receiving area for receiving the sample, the receiving area located rearwards from the front surface.

2. The sample mount of claim 1, wherein the sample projects above the front surface when disposed in the receiving area.

3. The sample mount of claim 1, further comprising a spring-loaded handle configured to press the sample against the interior face of the front surface.

4. The sample mount of claim 3, further comprising:
a back wall,
wherein the spring-loaded handle is disposed through the back wall, and
wherein the receiving area is bounded by the front surface and the back wall.

5. The sample mount of claim 3, further comprising at least one spacer configured disposed between the spring-loaded handle and the sample.

6. The sample mount of claim 1, further comprising a rotational actuator configured to rotate the sample about an axis normal to a front face of the sample.

7. The sample mount of claim 1, further comprising:
a first top face and a second top face separated by the opening; and
a first edge and a second edge, wherein the first edge extends from the first top face and the second edge extends from the second top face, the first edge and the second edge configured to align the sample.

8. A sample mount for electron backscatter diffraction data acquisition, comprising:
a front surface extending from a bottom surface of the sample mount, the front surface comprising:
a first exterior face;
an interior face oriented at an angle relative to the bottom surface;
an opening extending through the front surface such that the sample mount presents an open top for an unimpeded path from an SEM pole piece to a sample;
a first top face and a second top face separated by the opening;
a receiving area for receiving the sample; and
a spring-loaded handle configured to press the sample against the interior face of the front surface such that a front face of the sample is flush with the interior face, thereby presenting a planar surface to the SEM pole piece; and
a rotational actuator coupled to the spring-loaded handle configured to rotate the sample.

9. The sample mount of claim 8, wherein the sample projects above the first top face and the second top face when disposed in the receiving area.

10. The sample mount of claim 8, wherein the rotational actuator is configured to rotate the sample about a normal of the front face of the sample.

11. The sample mount of claim 10, wherein the rotational actuator is integral with the spring-loaded handle.

12. The sample mount of claim 11, wherein the rotational actuator is configured to be electronically controlled by a computer system.

13. The sample mount of claim 11, wherein the rotational actuator is a stepper motor.

14. The sample mount of claim 8, further comprising at least one spacer disposed between a back face of the sample and the spring-loaded handle.

15. The sample mount of claim 8, wherein the spring-loaded handle further comprises a twist-lock for maintaining a compressive force on the sample.

16. A multi-sample mount for electron backscatter diffraction comprising:
a plurality of sample mounts disposed adjacent to one another, each of the plurality of sample mounts comprising:
a front surface extending from a bottom surface of the sample mount, the front surface comprising:
an exterior face;
an interior face oriented at an angle relative to the bottom surface;
an opening extending through the front surface such that the sample mount presents an open top for an unimpeded path from an SEM pole piece to a sample;
a receiving area for receiving the sample; and
at least one spring-loaded handle configured to press the sample against the interior face of the front surface such that a front face of the sample is flush with the interior face, thereby presenting a planar surface to the SEM pole piece;
wherein pushing the sample against the interior face places the sample at the angle relative to the bottom surface.

17. The multi-sample mount of claim 16, wherein the multi-sample mount is configured to be translated within an SEM chamber to successively analyze the sample in each of the plurality of sample mounts.

18. The multi-sample mount of claim 16, wherein the at least one spring-loaded handle comprises a spring-loaded handle for each of the plurality of sample mounts.

19. The multi-sample mount of claim 18, wherein at least one of the plurality of sample mounts comprises at least one spacer disposed between a back face of the sample and a distal end of the spring-loaded handle.

20. The multi-sample mount of claim 16, wherein at least one of the plurality of sample mounts comprises:
a first edge and a second edge, wherein the first edge extends from a first top face of the front surface and the second edge extends from a second top face of the front surface, the first edge and the second edge configured to align the sample.

* * * * *